United States Patent [19]
McLaury

[11] Patent Number: 5,579,278
[45] Date of Patent: *Nov. 26, 1996

[54] MULTIPORT MEMORY WITH PIPELINED SERIAL INPUT

[75] Inventor: Loren L. McLaury, Boise, Id.

[73] Assignee: Micron Technology, Inc., Boise, Id.

[*] Notice: The term of this patent shall not extend beyond the expiration date of Pat. No. 5,452,259.

[21] Appl. No.: 504,006

[22] Filed: Jul. 18, 1995

Related U.S. Application Data

[63] Continuation of Ser. No. 153,120, Nov. 15, 1993, Pat. No. 5,452,259.
[51] Int. Cl.$^6$ ....................................................... G11C 7/00
[52] U.S. Cl. ............................... 365/230.05; 365/230.09; 365/219
[58] Field of Search ..................... 365/221, 219, 365/220, 230.05, 230.09

[56] References Cited

U.S. PATENT DOCUMENTS

| 4,048,077 | 3/1987 | Pinkham et al. | 365/189.12 |
|---|---|---|---|
| 5,260,905 | 11/1993 | Mori | 365/189.12 |
| 5,311,468 | 5/1994 | Anderson | 365/221 |
| 5,321,665 | 6/1994 | Balistreri et al. | 365/230.05 |
| 5,323,358 | 6/1994 | Toda et al. | 365/219 |
| 5,452,259 | 9/1995 | McLaury | 365/221 |

Primary Examiner—David C. Nelms
Assistant Examiner—Vu A. Le
Attorney, Agent, or Firm—Schwegman, Lundberg, Woessner & Kluth, P.A.

[57] ABSTRACT

A multiport memory having a serial input port receives serial data into a pipeline. The pipeline is emptied in response to a transfer signal at a time before the parallel transfer of data from a serial to parallel conversion register into memory. The pipeline in one embodiment includes in serial connection an input latch, a first isolation gate, a write register, a second isolation gate, an I/O bus, and means for equilibrating the I/O bus. The pipeline is controlled by write control logic so that the pipeline is emptied while equilibration of digit lines is being disabled. In a video random access memory (VRAM) embodiment, a tap counter and hold register specify the next position for serial access to the serial access register. These elements are controlled by write control logic in response to a transfer signal and a serial clock signal to allow the tap counter to increment while emptying the pipeline. When the pipeline is already empty, no increment takes place. In another embodiment, the input data latch is clocked toward the end of the serial clock cycle rather than near the beginning. The resulting negative setup time is useful in system designs wherein the serial clock is applied directly to processor logic to produce serial data and to multiport memory to receive the serial data after it has been produced.

15 Claims, 11 Drawing Sheets

би5,579,278

MULTIPORT MEMORY WITH PIPELINED SERIAL INPUT

CROSS REFERENCE TO RELATED APPLICATIONS

This application is a continuation of Ser. No. 153,120 filed Nov. 15, 1993, now U.S. Pat. No. 5,452,259, issued Sep. 19, 1995.

TECHNICAL FIELD

This invention relates to multiport memory and to systems for storing serial data in memory.

BACKGROUND

As an example of a system for storing serial data in memory, consider a multiport memory having a random access port and a serial access port. Such a memory finds application for example in computer display circuitry and digital communication network circuitry. The parallel port is conventionally coupled to a processor for read and write access. The serial port is conventionally coupled to a peripheral device such as a video display or a network transceiver for read and write access. In either case the multiport memory performs serial to parallel conversion for a serial stream of data written into the serial port so that received serial data is accessible in parallel via the random access port. Data transfer at the serial port is at a rate much faster than data transfer at the parallel port, hence data rate conversion is also accomplished.

To the designer of display systems and network systems, high serial data rate is of critical importance. A limited serial data rate to a display ultimately limits the display refresh rate and the amount of data that can be revised. In many systems, the quantity of data to be displayed is, therefore, limited, consequently, reducing the display resolution. Without sufficient resolution, some computing tasks are not feasible; especially tasks involving measurement, rendering of the displayed image onto film, and projection of the displayed image. For similar reasons, data rate is critical to network capacity and efficiency. When serial data rate is limited, fewer messages can be communicated and message length is reduced. Consequently, transmission of network control messages and retransmission of messages to eliminate transmission error become inefficient.

In many applications beyond displays and networks, it is desirable to support a high serial data rate into a memory device coupled to a processor. Many mass storage devices require data to be accessed serially. Measurement and control functions in process control systems often involve conversion between parallel and serial data representations. Without increased data rate capability, the advances in data processing, communication, measurement, mass storage, and display technologies are unavailable to the systems designer because the serial data rate stands as a systems bottleneck.

In view of the problems described above and related problems that consequently become apparent to those skilled in the applicable arts, the need remains for circuitry to write serial data at a high data rate into the serial port of a multiport memory.

SUMMARY

Accordingly, a system for storing data in a memory in one embodiment of the present invention includes a pipeline, a serial to parallel converter, a memory circuit, and a controller. The memory receives a serial data signal and a transfer signal. The pipeline sequentially stores data conveyed by the serial data signal. The converter converts data stored in the pipeline from serial to parallel. The memory circuit is coupled to the converter for storing data received in parallel therefrom. The controller responds to the transfer signal to transfer data from the pipeline to the memory circuit.

According to a first aspect of such a system, digit lines in the memory circuit are equilibrated while data is transferred from the pipeline to the converter in response to the transfer signal. By overlapping these operations, the process of emptying the pipeline does not extend the timing for a transfer operation. A device having a pipeline according to the invention is, therefore, compatible with existing applications for multiport memory.

According to another embodiment of the present invention, the memory receives a clock signal and the pipeline includes an input latch and a write register. The input latch stores data conveyed by the serial data signal in response to the clock signal. The write register stores data provided by the input latch. The controller transfers data from the write register to the converter in response to the clock signal. At a later time in the serial clock period, data in the input latch is transferred to the write register.

According to an aspect of this embodiment, input data can be latched while data is transferred from the write register to the converter. By overlapping these two operations, a shorter serial clock cycle is feasible and data at a higher serial data rate can be stored.

In another embodiment, the input data latch is clocked toward the end of the serial clock cycle rather than near the beginning. The resulting negative setup time is useful in system designs wherein the serial clock is applied directly to processor logic to produce serial data and applied to the multiport memory to receive the serial data after it has been produced. Not only is a high serial data rate supported by a memory of the present invention, but also systems of the invention have additional time for preparing serial data for the memory.

In another embodiment of the present invention, the converter includes a first serial access register (SAR), a counter for determining a position for serial access in the SAR, and a second register for holding the contents of the counter while the counter is incremented. The controller enables incrementing while enabling transfer of data from the pipeline to the first register at the position identified by the content of the second register. By performing these operations concurrently, a shorter serial clock cycle is feasible and data at a higher serial data rate can be stored.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

In each functional block diagram, a single line between functional blocks represents one or more signals including a group of signals that together signify a binary code. For example, a group of address lines represents a binary address at an instant in time. A horizontal or vertical bar represents a bidirectional bus. A line or a bar represents one or more conductors depending on the form of the signals conveyed between functional blocks.

Signals that appear on several figures and have the same mnemonic are directly or indirectly coupled together. A signal named with a mnemonic and a second signal named with the same mnemonic followed by an asterisk are related by logic inversion.

In each timing diagram the vertical axis represents binary logic levels and the horizontal axis represents time. A person having ordinary skill in the art will recognize where portions of a diagram have been expanded to improve the clarity of the presentation. The vertical axis is intended to show the transition from active (asserted) to passive (non-asserted) levels of each logic signal. The voltages corresponding to the logic levels of the various signals are not necessarily identical among the various signals.

In each process flow diagram, parallel columns illustrate process steps occurring concurrently from the top to the bottom of the page. Periods where no step is occurring in a column are shaded. When a process step is initiated in response to a signal, the signal is indicated on the left of the first column to which it applies. Other columns may also be initiated by the same signal as indicated in the description of the diagram. A process step that cannot be initiated until a prior step is completed is generally shown in the same column as the prior step. Steps in different columns are allowed to overlap in time to the extent discussed in the description of the diagram. A person having ordinary skill in the art will recognize where portions of the figure have been expanded to improve the clarity of the presentation.

DESCRIPTION

Figure 1:
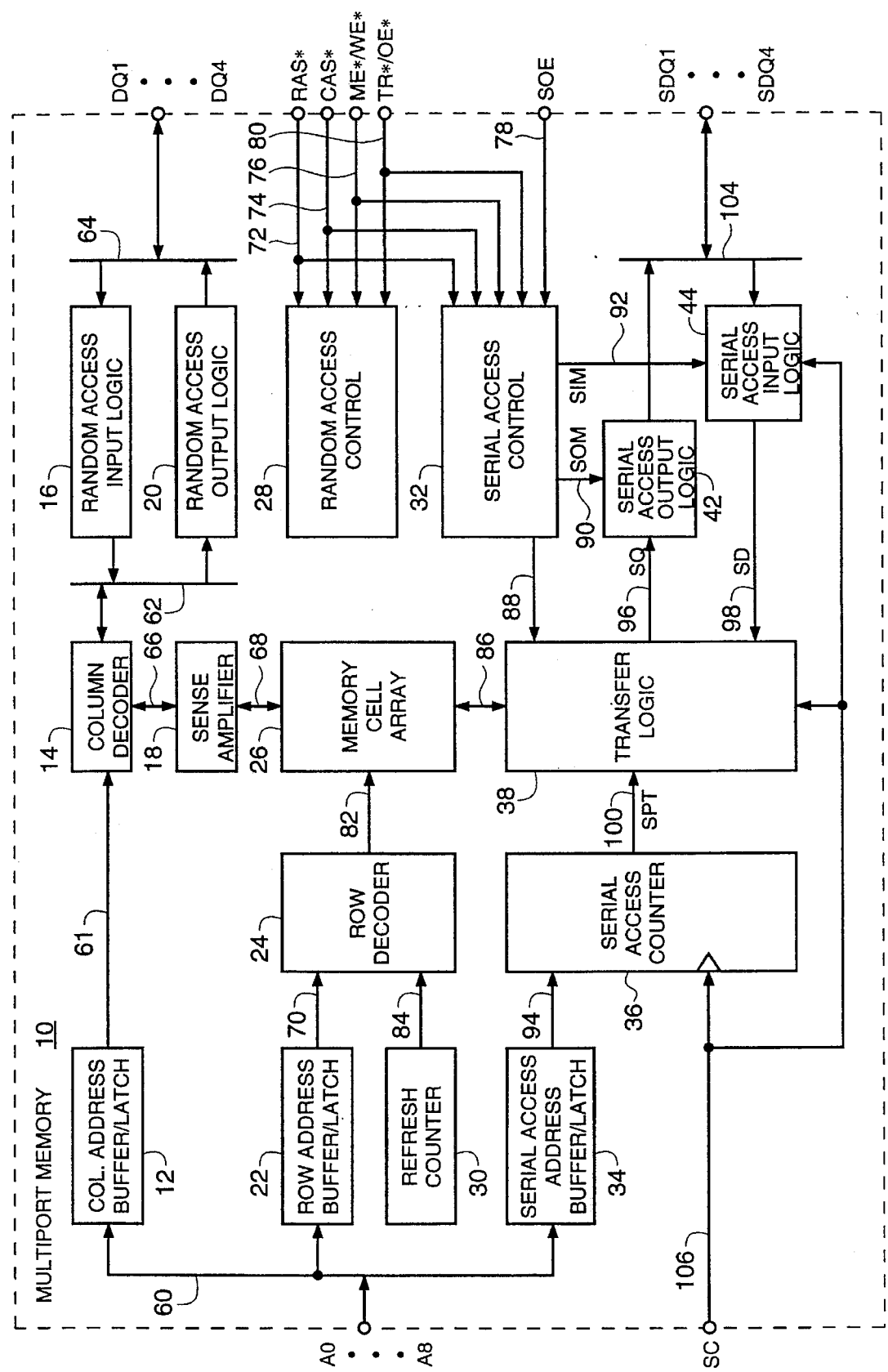
FIG. 1 is a functional block diagram of a multiport memory of the present invention.

FIG. 1 is a functional block diagram of a multiport memory of the present invention. Multiport memory 10 is formed as an integrated circuit. The memory includes an array of dynamic memory cells 26, means for random access 12–24 and 28, means for serial access 32–44, and means for refreshing the dynamic cells 24, 28, and 30. Multiport memory 10 is responsive to and provides signals well known in the art as described in specifications for Micron MT42C4255, a 256K×4 VRAM, described in DRAM Data Book 1992 at pages 5-1 through 5-38, incorporated herein by reference and Micron MT42C4064, a 64K×4 VRAM, described in DRAM Data Book 1990 at pages 3-3 through 3-26, incorporated herein by reference.

The memory array is organized in rows and columns, with four bits stored at each row-column location. A so-called random access port is a group of signal lines sufficient for performing read and write operations on a randomly selected group of bits taken in parallel. The random access port of multiport memory 10 includes lines 60, 64, 72–76 and 80.

Multiport memory 10 also includes a serial access port which includes lines 72–80, 104, and 106. Serial access control 32 coordinates the operation of serial access counter 36, transfer logic 38, output logic 42, and input logic 44. Cooperation of these blocks will be described in terms of a serial read operation and a serial write operation.

A serial read operation is generally preceded by a transfer of the bits from a row of cells of array 26 to transfer logic 38 where the bits are held in a register. Since memory cell array 26 is 4 bits (one nibble) deep, the register holds one nibble for each row position. Serial access control 32 generates serial read transfer signals on line 88 responsive to transfer signed TR* on line 80 for loading the register. Serial access control 32, counter 36 and transfer logic 38 cooperate as means for selecting a nibble from the register. Serial access control logic 32 also generates serial output mode signal SOM on line 90 to enable serial access output logic 42.

Generally, serial read operations in a system using multiport memory 10 are conducted in a burst of back-to-back, uninterrupted operations. The transfer of a row of nibbles to transfer logic 38 and the loading of serial access counter 36 with an appropriate starting value precede serial output operations. The starting value for counter 36 is received on line 60, held in serial access address buffer/latch 34, and conveyed on line 94 to the counter for loading.

Counter 36 responds to serial clock signal SC on line 106 for counting and, in some cases, loading. Counter 36 provides a binary count, known in the art as a tap address, shown as serial pointing signal SPT on line 100. Transfer logic 38 responds to signal SPT by providing on line 96 the nibble at the row position identified by signal SPT. The nibble on line 96 is represented as signal SQ that is input to serial access output logic 42. Output logic 42 couples signal SQ onto bidirectional bus 104 as signal SDQ1–SDQ4 when enabled by serial output mode signal SOM on line 90.

Counter 36 and transfer logic 38 cooperate as sequencing means for accessing the content of memory cell array 26, and as tap means for determining a position for serial access. Counter 36 in alternate and equivalent embodiments determines a position by decrementing, shifting, or memory look-up. Thus, counter 36 and transfer logic 38 in one embodiment cooperate as a sequencer. Signals for selecting in sequence a next nibble of cells include signal SPT on line 100.

Reception of serial clock signal SC on line 106 causes counter 36 to increment, signal SPT to identify a next nibble in sequence, and this next nibble to be provided on line 96. The serial read operation continues for each active transition of signal SC.

A serial write operation generally includes two phases. In a first phase, a large number of back-to-back, i.e. uninterrupted, write operations store one nibble at a time in a register in transfer logic 38. In a second phase, the contents of the register is written to a row in memory cell array 26. Serial access control 32 generates serial input mode signal SIM on line 92 to enable serial access input logic 44. During the second phase, serial access control 32 generates write transfer signal WT on line 88 for writing nibbles into memory cell array 26.

During the first phase, counter 36 operates as described above, loading a starting position and incrementally identifying sequential row positions in a register within transfer logic 38. Subsequent reception of signal SC on line 106 causes counter 36 to increment, signal SPT to identify a next position in sequence, and a nibble received on bus 104 to be latched and written into the register. The nibble is received on bidirectional bus 104 as signals SDQ1–4.

Figure 4:
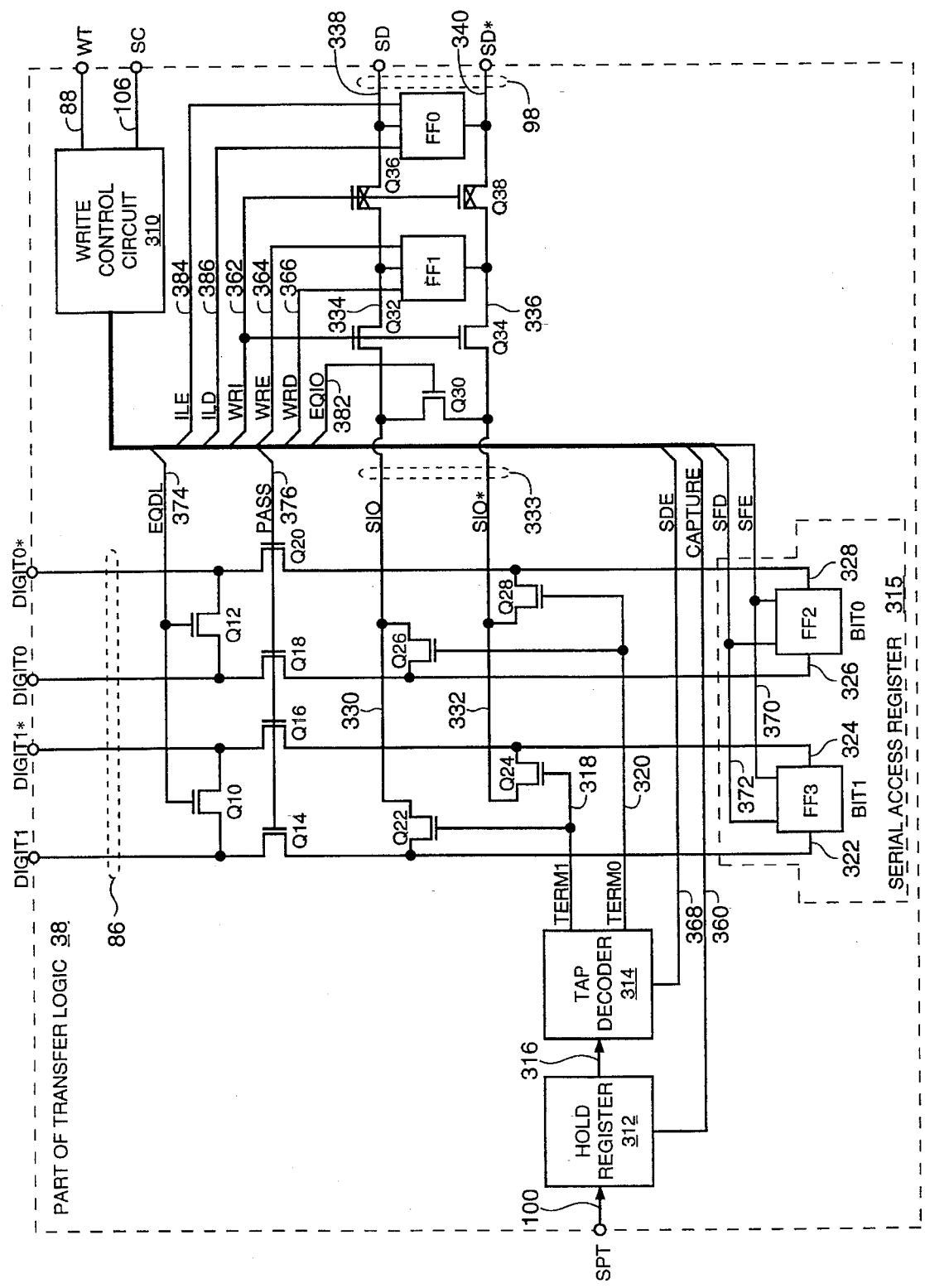
FIG. 4 is a schematic diagram of a portion of the transfer logic shown in FIG. 1.

Serial access input logic 44 responds to signals SDQ1–4 to provide serial data signal SD on line 98. Serial access input logic 44 includes means for isolating signals SDQ from signals SD when, for example, signal SD is conveyed on a bidirectional line as shown in FIG. 4.

In the second phase of a serial write operation, serial access control 32 generates write transfer signal WT on line 88 responsive to transfer signal TR* on line 80. Timing of signal WT is coordinated by signals, not shown, provided by random access control 28 to avoid conflicting simultaneous operations on memory cell array 26. The cooperation of signals used to access the memory via the serial access port are better understood from a process flow diagram.

Figure 2:
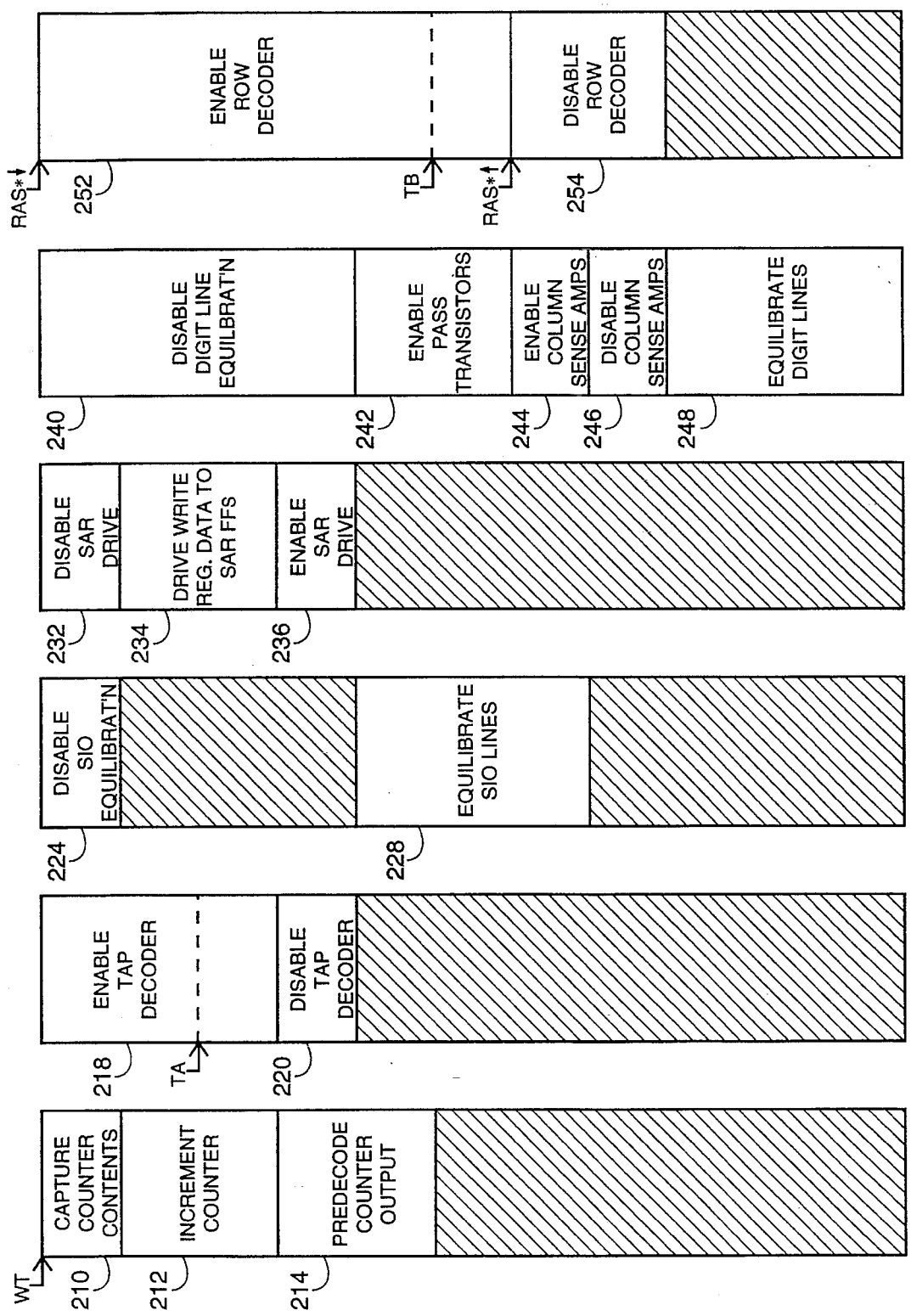
FIG. 2 is a process flow diagram illustrating operations performed in response to a transfer signal received by the memory of FIG. 1.

FIG. 2 is a process flow diagram illustrating operations performed in response to a transfer signal received by the memory of FIG. 1. These operations form a write transfer cycle and are performed by transfer logic 38 in cooperation with serial access control 32. In response to signal WT on line 88, steps 210, 218, 224, 232, and 240 are initiated concurrently. Signal TR* on line 80 precedes a falling edge of signal RAS* on line 72 to identify a write transfer cycle and to cause generation of signal WT on line 88. In response to a falling edge of signal RAS* on line 72, when TR* has been received, step 252 is initiated. When a rising edge of signal RAS, is received on line 72, step 254 is initiated.

In a memory of the present invention, five concurrent process flows are initiated on receipt of signal WT. In the first flow, the contents of counter 36 are captured in a register. The register contents are in binary to be decoded for the identification of one position in a serial access register. While the captured contents are provided for decoding, the counter is incremented in step 212 and the incremented value is partially decoded in step 214. Step 212 occurs while in step 218 as a previous tap address is being decoded.

In step 218, the captured contents are decoded to a stable result at time TA. The stable result is maintained for a hold time (shown below the dashed line) sufficient for a write operation on the serial access register. The decoding circuitry is enabled in response to signal WT and disabled after writing to limit power dissipation. In the embodiment shown, the step of predecoding, step 214 occurs, while in step 220 further decoding is being disabled.

In the embodiment shown in FIG. 1, lines 96 and 98 provide separate data lines for serial read and serial write data respectively. In an alternate embodiment, lines 96 and 98 may be combined on a bidirectional bus called the serial I/O bus. In one embodiment the bus includes a pair of lines for true and complement data. In such an embodiment, the bus is referred to as the SIO lines. Steps 224 and 228 illustrate the process of disabling and enabling equilibration of the SIO lines. The SD signal on line 98 is driven onto the SIO lines after equilibration and is held until after a write operation on the serial access register has been completed.

Transfer logic 38 includes a write register which forms a pipeline beginning with an input latch of serial access input logic 44. Steps 232, 234, and 236 accomplish the transfer of data from the write register into the serial access register at the position decoded at time TA. By transferring data from the write register to the serial access register, the pipeline is emptied. Steps 232–236 occur while in step 240 digit line equilibration is being disabled. Steps 232–236 occur while in step 212 a subsequent tap address is being determined.

Memory array 26 includes, in one embodiment, a pair of digit lines conveying true and complement data for each column. Digit lines and memory array architecture of the type employed in memory array 26 are shown and described in U.S. patent application Ser. No. 07/730,367 by Lee. Digit lines are maintained in an equilibrated condition to reduce transition time to a binary logic level. In step 240, digit line equilibration is disabled so that the contents of the serial access register can drive the digit lines to levels corresponding to data in the serial access register. In steps 242 and 244 the output of the serial access register is passed, i.e. coupled, to the memory array and cells of the array are written. After cells are written, the column sense amplifiers are disabled in step 246 and the digit lines are equilibrated in step 248.

The contents of the serial access register are written to cells of the array. These cells are part of a selected row of the array. When RAS, falls, signals A0–A8 on line 60 identify the selected row. Signals A0–A8 form a binary code to be decoded for the identification of one row. In step 252 the row decoder is enabled and a stable result is provided at time TB. The stable result is maintained for a hold time (shown below the dashed line) sufficient for a write operation on the cells of the row. The decoding circuitry is disabled after writing to limit power dissipation.

The process described in FIG. 2 is independent of whether a new tap address is subsequently received, i.e. whether CAS* falls at a time when signals A0–A8 convey a tap address to be loaded into counter 36. Data conveyed by serial data signal SD after receipt of a new tap address will be written first to the pipeline and then to the serial access register. Premature incrementing of the new tap address is avoided as will be discussed with reference to FIG. 3.

Figure 3:
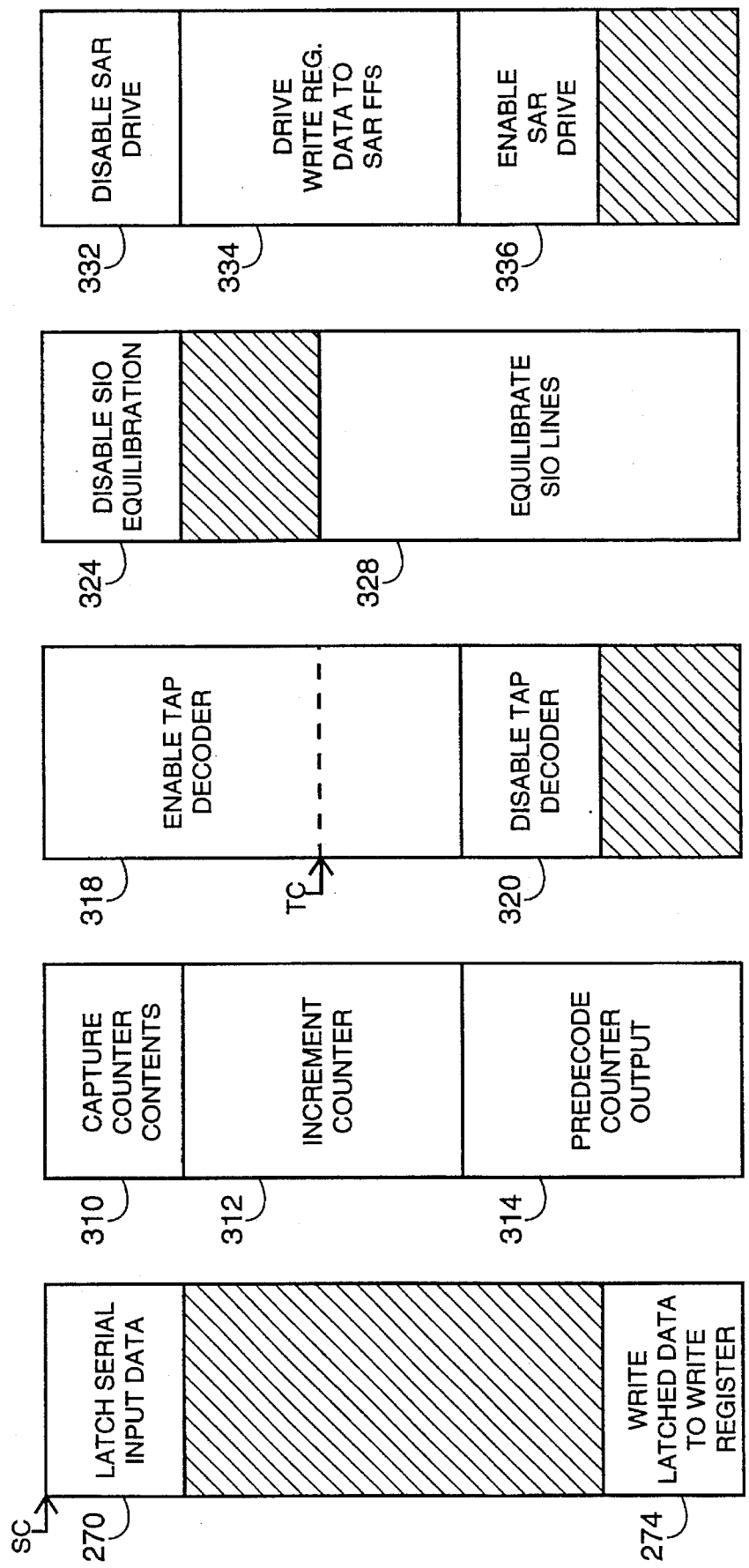
FIG. 3 is a process flow diagram illustrating operations performed in response to a serial clock signal received by the memory of FIG. 1.

FIG. 3 is a process flow diagram illustrating operations performed in response to a serial clock signal received by the memory of FIG. 1. These operations form a serial write cycle and are performed by transfer logic 38 in cooperation with serial access control 32 and serial access input logic 44. In response to signal SC on line 106, steps 270, 310, 318, 324, and 332 are initiated concurrently.

In step 270, data conveyed by signal SDQ on bus 104 is latched in serial access input logic 44. Step 270 in one embodiment begins immediately after the serial clock signal is received. In alternate embodiments, step 270 begins at any time before the end of the process depicted in FIG. 3, even at a time simultaneous with step 274; as will be discussed with reference to FIG. 7.

After the contents of the write register are no longer needed, the content of the input latch of input logic 44 is transferred to the write register in step 274. Hence, data is transferred in the pipeline while in step 328 serial I/O lines are being equilibrated.

Steps 310 through 336 are not performed in response to the first serial clock signal received after the pipelining is known to be empty. The pipeline is known to be empty immediately following application of system power and after a transfer cycle.

Operations in the second group of steps, steps 310–336, are similar to operations in the first group of steps, steps 210–236, discussed above with reference to FIG. 2 except that the first group of steps is initiated by write transfer signal WT on line 88 and the second group of steps is initiated by serial clock signal SC on line 106.

FIG. 4 is a schematic diagram of a portion of transfer logic 38 shown in FIG. 1. The circuitry shown in FIG. 4 accomplishes the operations described by the process flow diagrams in FIGS. 2 and 3. Transfer logic 38 includes hold register 312, decoder 314, serial access register 315, pass transistors Q14–Q20, write control circuit 310, and a pipeline circuit. Flip flops FF0 and FF1, and isolation gates Q32–Q38 form pipelining means for sequentially storing data conveyed by serial data signals SD and SD*. Serial I/O lines 330 and 332 form a bus that is equilibrated by transistor Q30. Digit lines shown collectively as 86 in FIGS. 1 and 4 are shown in pairs; each pair equilibrated respectively by transistor Q10 and Q12.

Flip flop FF0 serves as a register for storing data conveyed by the serial input data signal. In an alternate and equivalent embodiment, flip flop FF0 is included in serial access input logic 44. In such an embodiment, lines 338 and 340 are coupled selectively to bus 104 for receiving signals SDQ and SDQ*. When FF0 drives lines 338 and 340, it provides a pipe signal conveying data to the next stage, FF1, of the pipeline.

To simplify the discussion of operation of the embodiment shown in FIG. 1, only two terms of decoder 314 are shown. Likewise, only two columns are shown including a pair of digit lines in each column. Similarly, only two bit positions of serial access register are shown, although the register in one embodiment has a position for each column in a row of memory array 26 and four flip flops per position for storing one nibble per position, i.e. a depth of 4 bits per position. The bus shown is formed from one pair of SIO lines, although the bus in one embodiment has a number of pairs matching the number of bits of depth in the serial access register. The pipeline shown is two positions long and one bit deep. For simplicity, only one bit per stage in the pipeline is shown, though four bits per stage would be necessary for storing a nibble in each stage of the pipeline.

Variations in the architecture of the pipeline that are within the scope of the present invention include providing several stages that together match the depth of the serial access register. For example, two stages of a nibble deep pipeline are used in an alternate embodiment to convey data on an eight bit bus to one position of a serial access register that is one byte deep. Variation in the number of bits in the pipeline, the number of pairs in the bus, the number of bits per position in the serial access register, the number of columns per serial access register, and the extent of decoding are within the scope of the present invention.

Serial pointing signal SPT is received on line 100 by hold register 312. Register 312 is coupled to decoder 314 so that the contents of register 312 are maintained while counter 36 shown on FIG. 1 is incremented. Responsive to the output of register 312, decoder 314 enables one pair of transistors, for example Q22 and Q24, by a signal TERM1 on line 318. Decoder 314 enables one term signal and disables all other term signals.

Transistors Q22 and Q24 couple the bus formed by lines 330 and 332 to one position of serial access register 315 so that data conveyed by signals on the bus is stored in flip flop FF3. When decoder 314 is disabled, none of the term signals are activated.

Pass transistors, for example Q14 and Q16, are enabled by signal PASS on line 376, so that data stored in serial access register 315 flip flop FF3, representing position BIT1, is conveyed to a column for storage in memory array 26. Transistors Q14 and Q16 form a transfer gate, i.e. transfer means for transferring data between the serial access resistor and memory cells. In an alternate and equivalent embodiment, transfer means includes a transport latch.

Transistor Q10 equilibrates a pair of digit lines after storage is completed. Transistors Q10 and Q12 each serve as equilibrating means for establishing an equilibrated potential on each digit line. Transistor Q30, likewise, equilibrates bus 333 by establishing an equilibrated potential on each serial I/O line. The equilibrated potential is selected by design choice and in some embodiments, equilibrating means includes pull-up or pull-down circuits.

Transistors Q12, Q26, and Q28, as well as flip flop FF2 cooperate with decoder 314 for conveying data from bus 333 to the column represented by signals DIGIT0 and DIGIT0* in a way analogous to that already described for the column represented by signals DIGIT1 and DIGIT1*.

Transistors Q32–Q38 cooperate as means for selectively coupling the I/O lines of a flip flop to a bus for providing and receiving signals to and from the bus. In alternate and equivalent embodiments, other well known devices for data selection, multiplexing, tristate buffering, and switching are used for selectively coupling and isolating. Isolation is sufficient when signals are effectively conveyed on isolated lines without interference.

The operation of write control circuit 310 and the pipeline circuit will be better understood with reference to timing diagrams.

Figure 5:
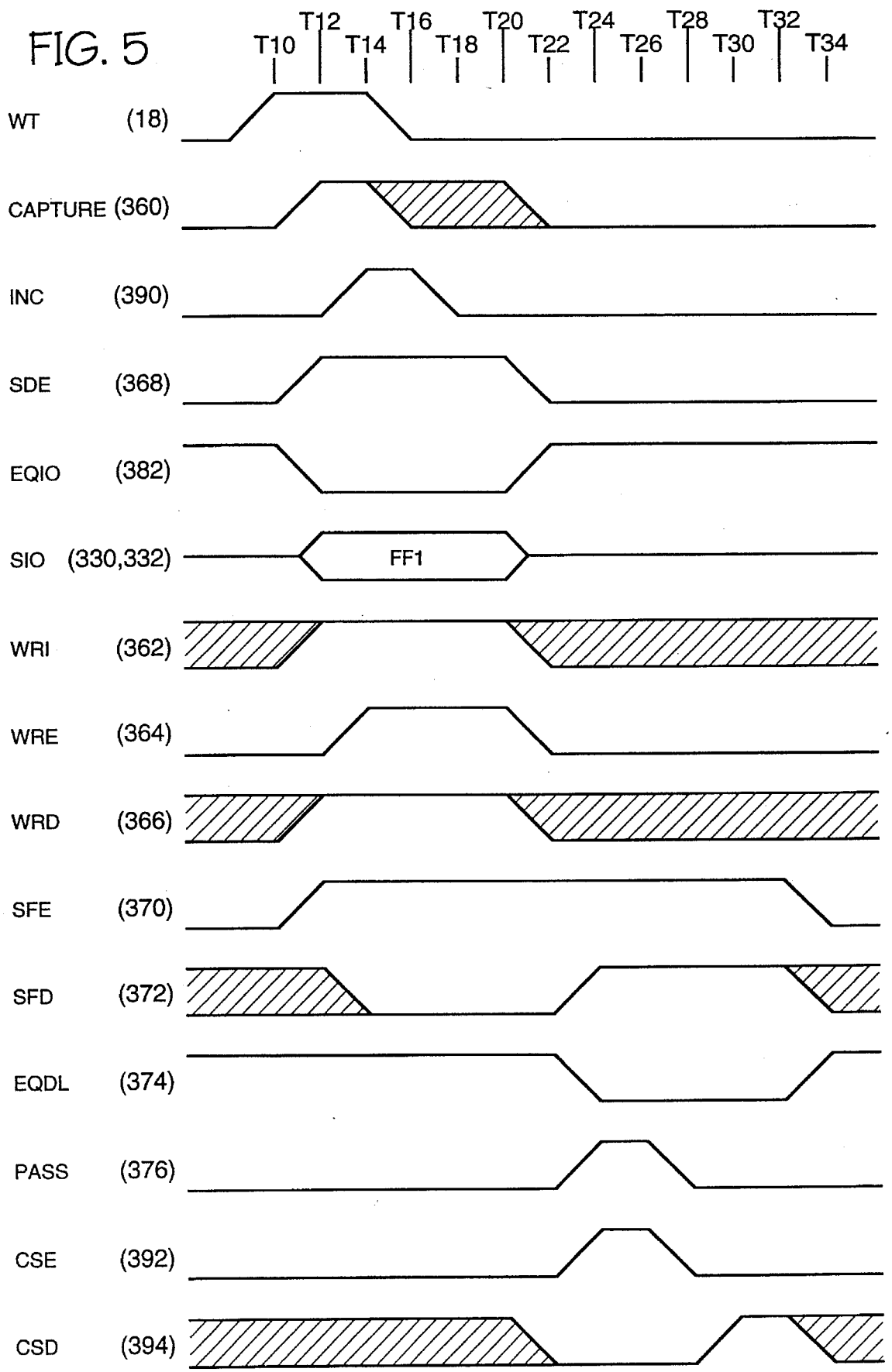
FIG. 5 is a timing diagrams of signals shown in FIG. 4 for a write transfer cycle.

FIG. 5 is a timing diagram of signals shown in FIG. 4 which accomplish a write transfer cycle according to the process steps illustrated in FIG. 2. At time T10 signal WT is received on line 88 identifying the beginning of a write transfer cycle.

Signal CAPTURE is activated on line 360 from time T12 to time T14 so that counter 36 contents are held for decoding. In an alternate embodiment, contents are held in a transparent latch and signal CAPTURE is held high until time T20 when the transfer of data from FF1 to the serial access register has been completed.

From time T14 to time T16, signal INC 390, not shown in FIGS. 1 or 4 for clarity, enables counter 36 to increment.

From time T12 to Time T20, signal SDE is generated on line 368 to enable decoder 314. While enabled, equilibration of the bus is disabled by signal EQIO on line 382 and write register content, i.e. the content of flip flop FF1, is driven onto bus 333. Signal WRI on line 362 isolates the input latch, flip flop FF0, from bus 333 from time T12 to time T20. Signal WRI is maintained high in an alternate embodiment to simplify the circuitry of write control 310. Identification of the position in serial access register 315 and transfer of data from FF1 to the identified position are accomplished by time T20. Signal WRD is maintained high in an alternate embodiment to maintain the state of FF1. Signals SFE on line 370 and SFD on line 372 cause data from the bus to be stored by time T24 at the identified position of serial access register 315. At time T20 signal EQIO rises so that bus 333 is equilibrated and signal SDE falls to disable decoder 314.

From time T24 to time T32, the contents of serial access register 315 are transferred to memory array 26. Equilibration of the digit lines is disabled when signal EQDL on line 374 falls at time T24. Pass transistors are enabled to couple register 315 to the digit lines from time T24 to time T26 by signal PASS on line 376. Storage of data in the memory array is accomplished by signals CSE 392 and CSD 394 representing columns sense amplifier enable and drive control signals. In alternate embodiments, control signals appropriate to other column architectures known in the art are used to effect writing of data into the array. In a DRAM or VRAM, for example, signal CSE corresponds to a row signal and signal CSD corresponds to a signal conventionally known as NLAT for latch N-sense amplifier.

At time T34, digit lines are returned to equilibrated potentials, and pass transistors are disabled to permit random access operations on memory array 26. Signals EQDL, PASS, CSE, and CSD are shown in FIG. 5 at minimum functional durations. In one embodiment, the time from T10 to T24 is short compared to the time T24 to time T34 due to physical constraints of writing a row of a DRAM array. When the structure of the flip flops used in serial access register 315 makes provision of a drive signal desirable to maintain data stored, drive signal SFD on line 372 remains active high between cycles. Similarly, when the structure of cells used in memory-array 26 makes provision of a drive signal desirable to maintain data stored, drive signal CSD remains active high between cycles.

Figure 6:
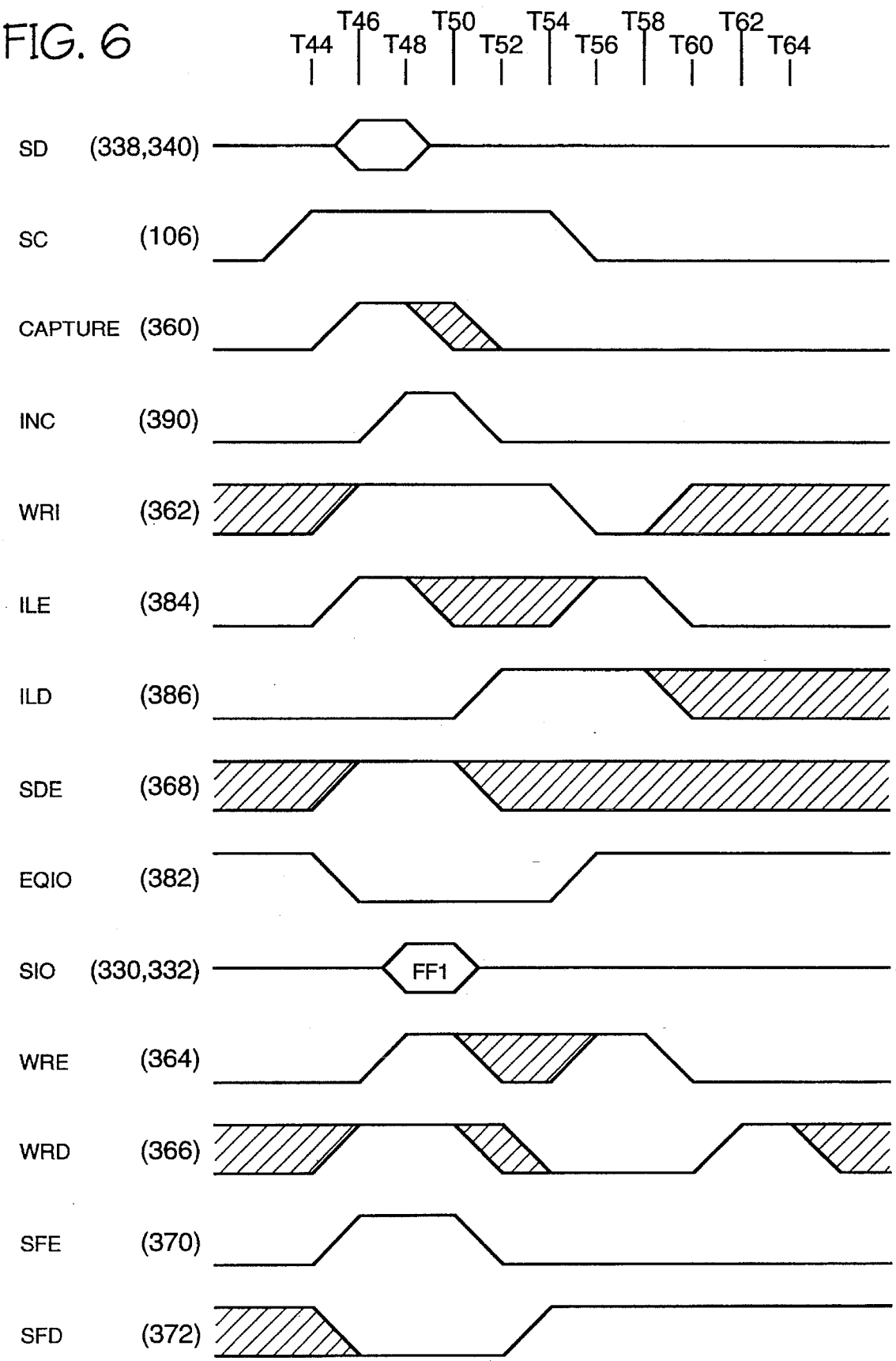
FIG. 6 is a timing diagram of signals shown in FIG. 4 for a serial early write cycle.

FIG. 6 is a timing diagram of signals shown in FIG. 4 which accomplish a serial early write cycle according to the process steps illustrated in FIG. 3. At time T44, signal SC is received on line 106 identifying the beginning of a serial clock cycle.

Signal CAPTURE is activated on line 360 from time T46 to time T48 so that counter 36 contents are held for decoding. In an alternate embodiment, contents are held in a transparent latch and signal CAPTURE is held high until time T20 when the transfer of data from FF1 to the serial access register has been completed.

From time T48 to time T50, signal INC 390, not shown in FIGS. 1 or 4 for clarity, enables counter 36 to increment.

At time T46, signals SD and SD* are received on lines 338 and 340. The write register, flip flop FF1, is isolated from the input latch, flip flop FF0, by signal WRI on line 362. By time T52, data conveyed by signals SD and SD* is stored in FF0 by signals ILE on line 384 and ILD on line 386.

In addition to isolating flip flop FF0 from flip flop FF1, signal WRI couples flip flop FF1 to bus 333. Signal EQIO disables equilibration of bus 333 at time T46. Bus 333 is coupled to the identified position of serial access register 315 by time T48 when the output of decoder 314, enabled by signal SDE on line 368, is stable. Signals WRE, WRD, SFE, and SFD cooperate to transfer the content of FF1 into the identified position of register 315 by time T54.

At time T56, input latch, flip flop FF0, is coupled to write register, flip flop FF1, for transfer of input data to the write register. Signal WRI is low from time T56 to time T58 to couple FF0 to FF1. Signals WRE and WRD complete the transfer by time T64.

In alternate and equivalent embodiments, signals having cross hatched waveforms are either high or low for purposes responsive to design choices including preservation of data in flip flops (WRD and ILD), noise immunity (ILE, WRE, and SFE), power savings (SDE), and simplicity of circuitry in write control 310.

Figure 7:
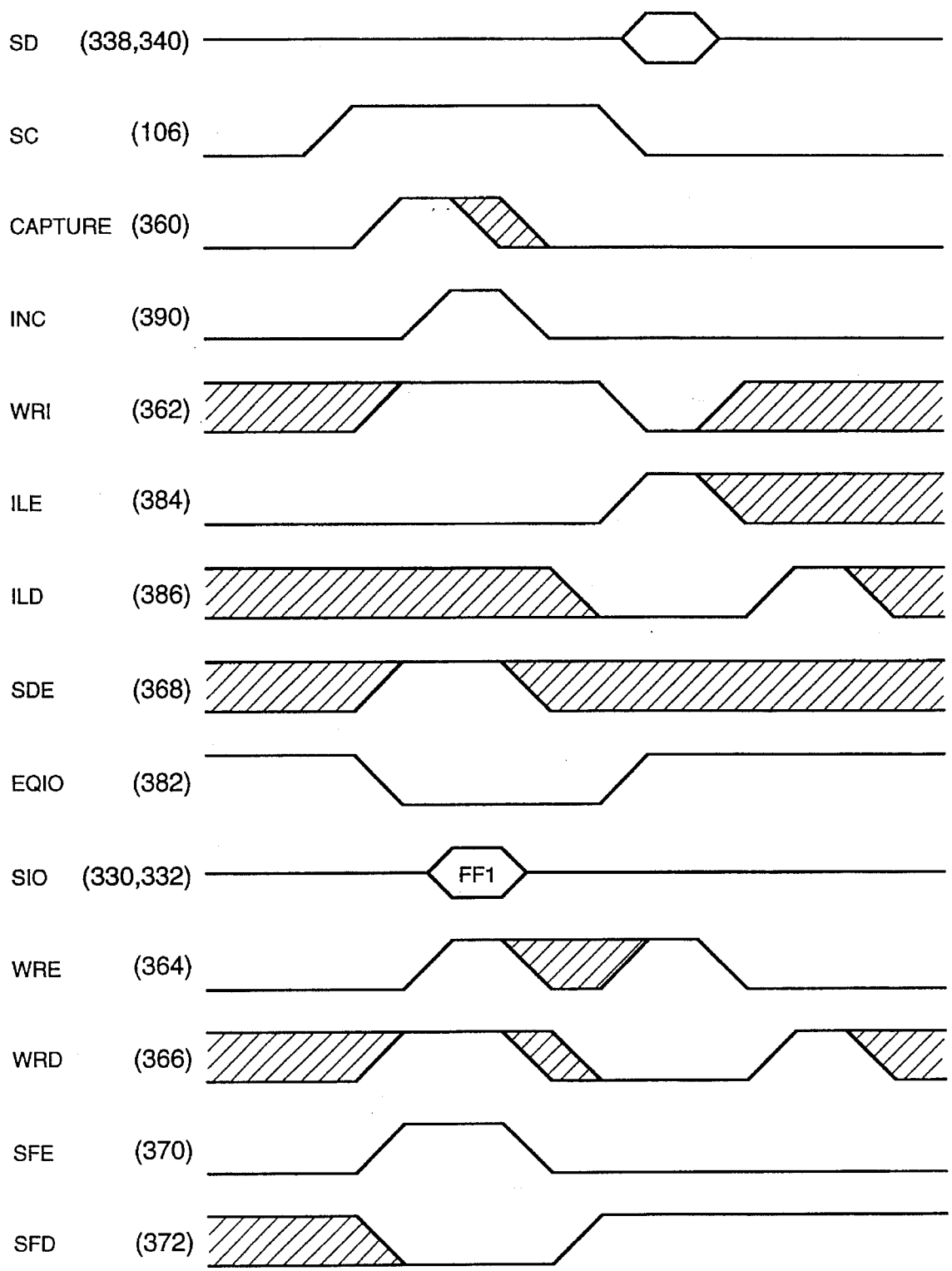
FIG. 7 is a timing diagram of signals shown in FIG. 4 for a serial late write cycle.

FIG. 7 is a timing diagram of signals shown in FIG. 4 which accomplish a serial late write cycle. All signals on FIG. 7 are identical to signals on FIG. 6 except serial input data SD, and input latch enable and drive signals ILE and ILD respectively. Since serial input data signal SD is not needed until after the contents of write register FF1 have been stored in serial access register 315, in a serial late write cycle, input data is latched at a later time in the cycle.

At time T84, signals SD and SD, are received on lines 338 and 340. Signal ILE on line 384 couples SD and SD* to opposite sense nodes of a flip flop and signal ILD on line 386 enables the flip flop to reach a stable state, thereby storing the data conveyed by signals SD and SD*.

Figure 10:
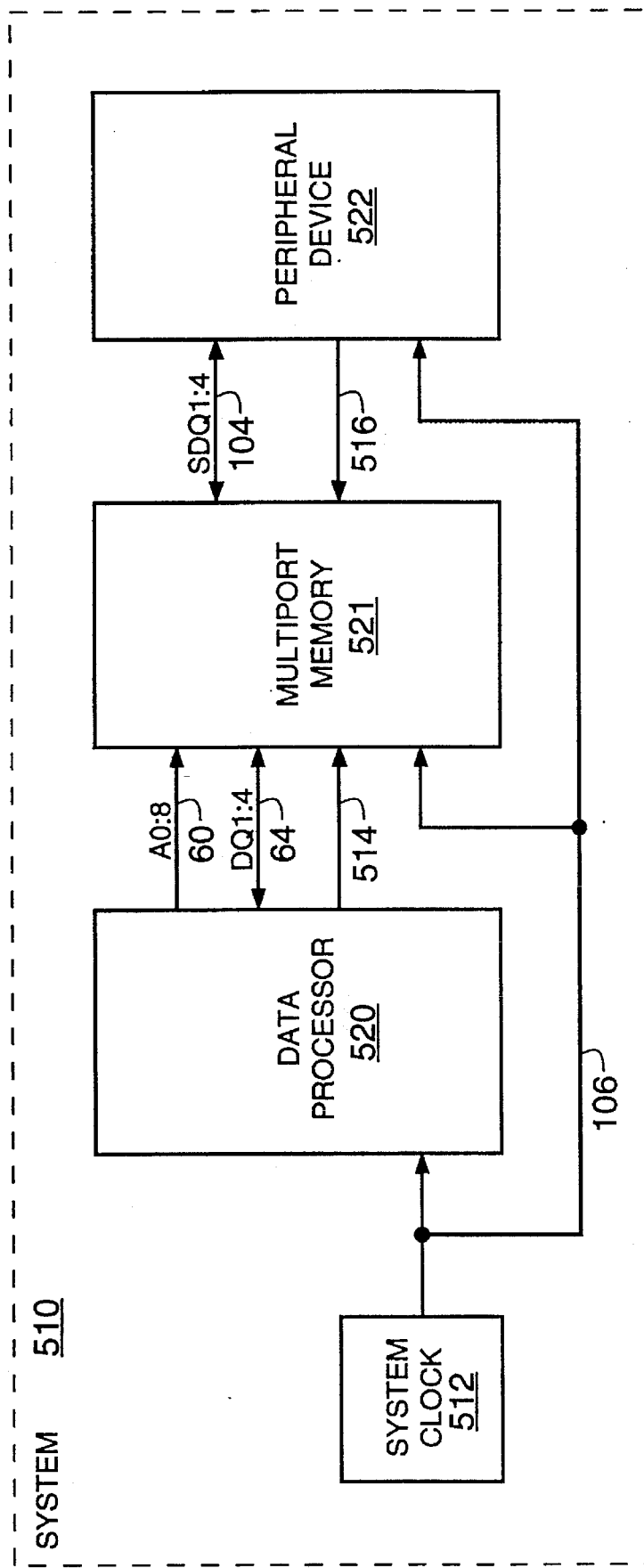
FIG. 10 is a functional block diagram of a system of the present invention.

An alternate embodiment of transfer logic 38 for exclusively supporting serial late write cycles is identical to that shown in FIG. 4 without flip flop FF0. Signals WRI, WRE, and WRD cooperate to latch input data into flip flop FF1 at a time after the contents of flip flop FF1 have been transferred to serial access register 315. A memory according to such an embodiment is shown in FIG. 10 as multiport memory 521.

In still another alternate embodiment, serial access control 32 includes logic for distinguishing serial early write from serial late write cycles and conveys identifying signals on line 88 to transfer logic 38 as shown in FIG. 1. Write control circuit 310 shown on FIG. 4 includes logic responsive to signals on line 88 to perform the timing sequence appropriate to the identified cycle. Whether to implement this variation, and the production circuitry for implementation are design choices within the ability of those of ordinary skill.

Figure 8:
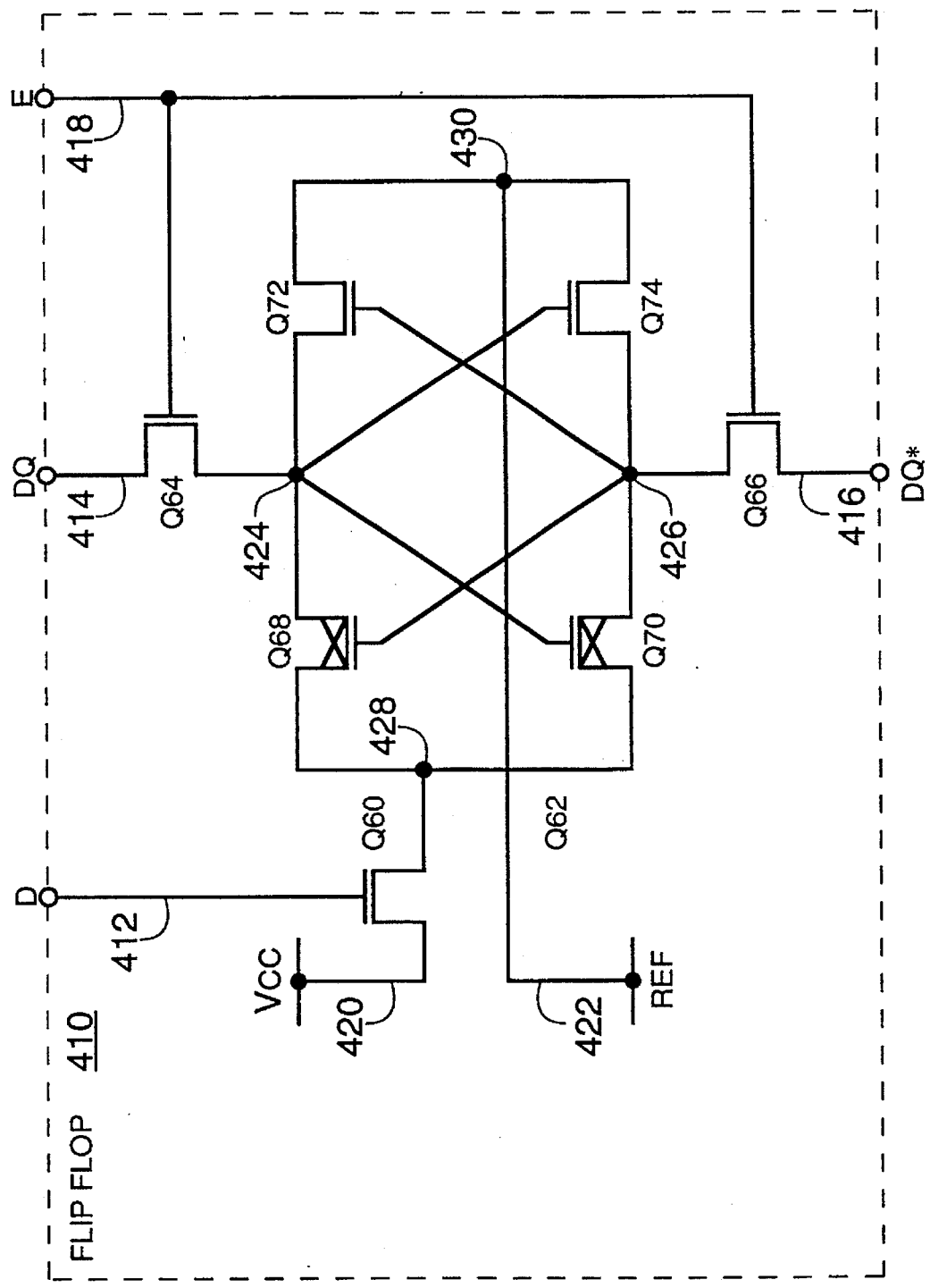
FIG. 8 is a schematic diagram of a flip flop shown in FIG. 4.

FIG. 8 is a schematic diagram of a flip flop shown as FF0–3 in FIG. 4. Flip flop 410 is shown to further explain the timing relationships for signals shown on FIGS. 6 and 7. Other flip flop circuits are used in alternate and equivalent embodiments. When flip flop 410 is used as FF0 or FF1 in FIG. 4, signals DQ and DQ* correspond to signals SD and SD*. When flip flop 410 is used in serial access register 315, signals DQ and DQ* correspond to signals SIO and SIO* of bus 333. In a similar manner signal E on line 418 corresponds to one of the signals ILE, WRE, and SFE; and, signal D on line 412 corresponds to one of the signals ILD, WRD, and SFD.

When enable signal E on line 418 is high, the potential on lines 414 and 416 is coupled through transistors Q64 and Q66 respectively to charge nodes 424 and 426. Signal E, when low, isolates nodes 424 and 426 from lines 414 and 416, respectively. Line 420 and transistor Q60 accomplish a pull-up function by supplying current to node 428. When drive signal D on line 412 subsequently goes high, the P-sense amplifier formed by transistors Q72 and Q74 and the N-sense amplifier formed by transistors Q68 and Q70 cooperate to amplify the charge on nodes 424 and 426 to attain one of two stable states. The data, thus stored in flip flop 410, i.e. the state of flip flop 410, is used to drive signals DQ and DQ* when enable and drive signals are both high. When driving SIO lines, flip flops FF0 and FF1 are said to be providing a pipe signal.

Figure 9:
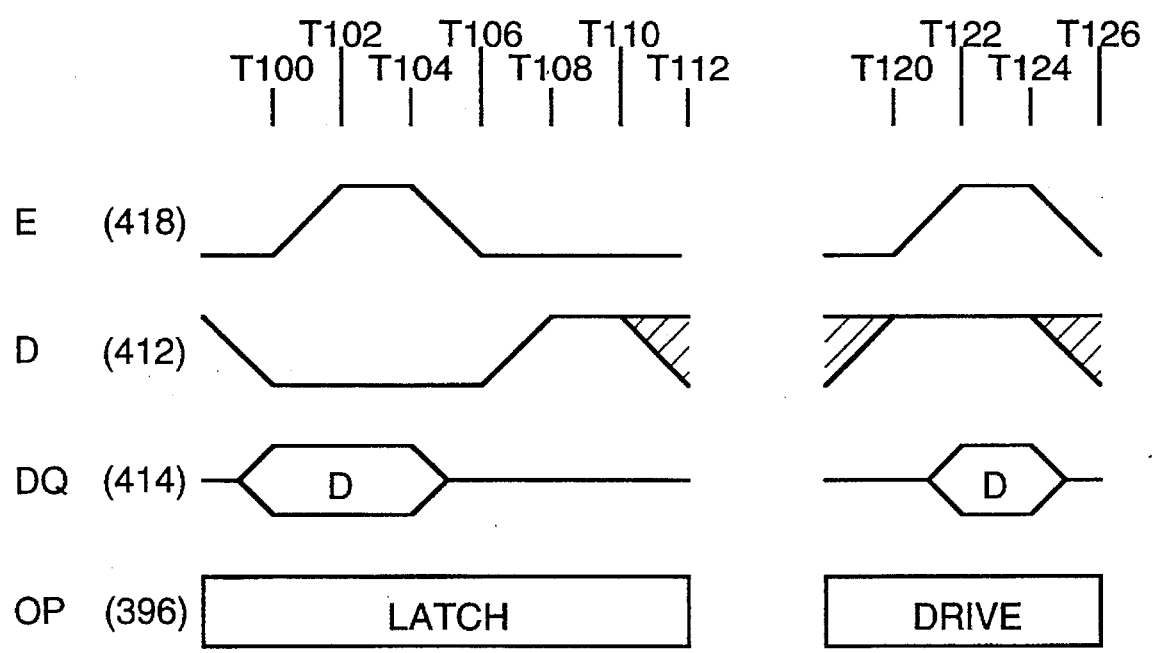
FIG. 9 is a timing diagram describing the operation of the flip flop shown in FIG. 8.

FIG. 9 is a timing diagram describing the operation of the flip flop shown in FIG. 8. Two operations 396 are supported: latching and driving. When enable signal E goes high while drive signal D is low, data conveyed by signal DQ from time T100 to time T104 is latched, i.e. stored, in flip flop 410. At time T110, the storage operation is complete. When enable signal E and drive signal D are both high, signals DQ and DQ* conveying the data stored are provided by flip flop 410. In the driving operation, the output signal is active from time T122 to time T124.

FIG. 10 is a functional block diagram of a system of the present invention. System 510 includes system clock generator 512, data processor 520, multiport memory 521 and peripheral device 522. System clock generator 512 provides serial clock signal SC on line 106 for synchronous system operation. Data processor 520 is coupled to a random access port of multiport memory 521 as indicated by lines 60, 64, and control signals on line 514. Peripheral device 522 is coupled to a serial access port of multiport memory 521 as indicated by lines 104 and control signals on line 516.

Multiport memory 521 is an embodiment of memory 10 that exclusively supports serial late write cycles as shown and described with reference to FIG. 7. In the embodiment shown in FIG. 10, the input data is clocked toward the end of the serial clock cycle rather than near the beginning. The resulting negative setup time provides more time for data processing circuits in peripheral device 522 to prepare serial data for storage in multiport memory 521.

The foregoing description discusses preferred embodiments of the present invention, which may be changed or modified without departing from the scope of the present invention.

For example, pipelining means for sequentially storing data conveyed by a serial data signal alternatively includes a shift register coupled to the serial clock and serial data signals. In yet another equivalent embodiment, pipelining means includes an addressable register used in conjunction with data selection and multiplexing circuitry. The addressable register and selection circuitry are similar to counter/SAR circuitry.

Serial to parallel conversion by converting means, in an alternate embodiment, includes a shift register also known in the art as a barrel shifter.

Controlling means for controlling writing, i.e. a data transfer or storage operation, in one embodiment is implemented with gate level logic circuitry, the design of which is well known in the art. In alternate embodiments, controlling means includes programmable logic or state machine circuitry and firmware.

Figure 11:
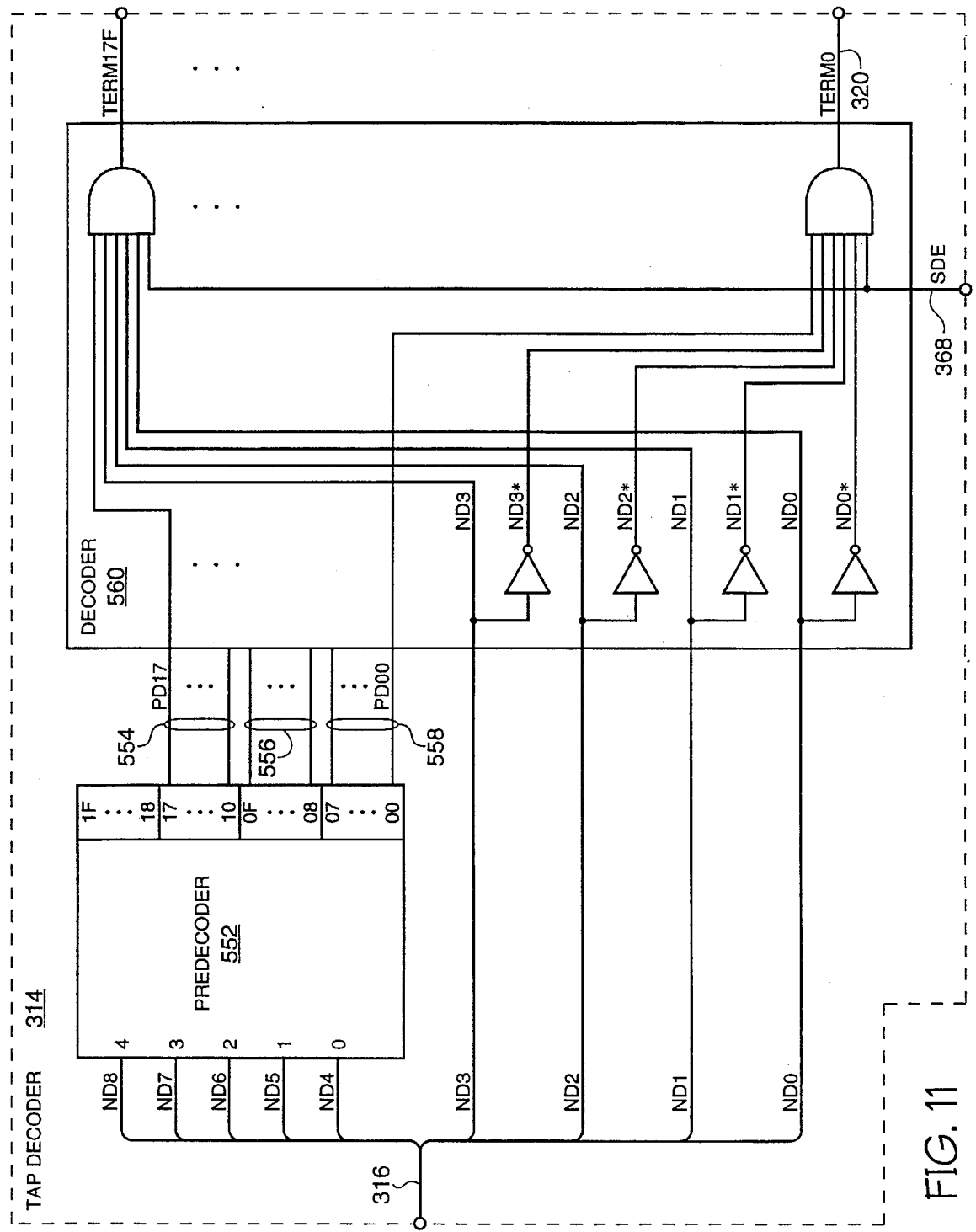
FIG. 11 is a schematic diagram of tap decoder 314 shown in FIG. 4.

Means for decoding a tap address includes, in an alternate embodiment, means for predecoding. The extent of predecoding is a design choice balancing speed and power dissipation results. FIG. 11 is a schematic diagram of tap decoder 314. In this embodiment, signal 316 conveys a nine bit binary value to predecoder 552. Predecoder 552 asserts one of 24 intermediate terms coupled to decoder 560 in three groups 554, 556, and 558 of eight signals. Decoder 560, when enabled, asserts one of 384 terms. Signal SDE is coupled by logic AND with the 24 intermediate terms to disable decoder 560.

P-channel FETs discussed above are replaced with N-channel FETs (and vice versa) in some applications with appropriate polarity changes in controlling signals as required. Moreover, the P-channel and N-channel FETs discussed above generally represent active devices which are replaced in some applications with bipolar or other technology active devices.

These and other changes and modifications are intended to be included within the scope of the present invention.

While for the sake of clarity and ease of description, several specific embodiments of the invention have been described; the scope of the invention is intended to be measured by the claims as set forth below. The description is not intended to be exhaustive or to limit the invention to the form disclosed. Other embodiments of the invention will be apparent in light of the disclosure to one of ordinary skill in the art to which the invention applies.

The words and phrases used in the claims are intended to be broadly construed. A "system" refers generally to electrical apparatus and includes but is not limited to a packaged integrated circuit, an unpackaged integrated circuit, a combination of packaged or unpackaged integrated circuits or both, a microprocessor, or a microcontroller, digital signal processor, arithmetic processor, measurement unit, combinations thereof, and equivalents.

A "memory" refers to a dynamic random access array (DRAM), static random access memory (SRAM), video random access memory (VRAM), an array of charge storage cells, an array of flip flops, a register, a flip flop, a charge-coupled device, combinations thereof, and equivalents.

A "signal" refers to mechanical and/or electromagnetic energy conveying information. When elements are coupled, a signal can be conveyed in any manner feasible in light of the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "value." The signal conveys data by virtue of its value. The amplitude may be instantaneous or an average. For a binary (digital) signal, the two characteristic values are called logic levels, "high" and "low."

The terms "latched," "stored", "writen", and "transferred", and grammatical variations thereof are synonymous. Similarly, a cell, a latch, a flip flop, and a register refer to means for storing data. Data storage is accomplished in one embodiment by cross-coupled gates and equivalently in an alternate embodiment by charge storage on an isolated circuit node.

What is claimed is:

1. A memory device comprising:

an array of memory elements;

a serial access input latch;

a serial access write register coupled to said input latch;

a serial to parallel conversion register coupled to said write register;

an access device having a control input, said access device coupled between said conversion register and said array of memory elements; and a timing control circuit coupled to the control input of said access device.

2. The memory of claim 1, wherein said conversion register is responsive to a write transfer request command to serially receive a data bit from said write register and then to transfer a plurality of data bits in parallel to said array of memory elements.

3. A memory device comprising:

an array of memory elements;

a serial access input register;

an isolation device comprising a control input, a first terminal and a second terminal, the first terminal coupled to said serial access input register;

a serial access pipeline register coupled to the second terminal;

a serial to parallel conversion register coupled to said pipeline register;

an access device having a control input, said access device coupled between said conversion register and said array of memory elements; and a timing control circuit coupled to the control input of said access device and to the control input of said isolation device.

4. The memory device of claim 3, wherein said timing control circuit is responsive to a write transfer command to serially transfer data from said pipeline register to said conversion register, and then to transfer the data from said conversion register to said array of memory elements.

5. A memory device comprising:

an array of memory elements;

a serial access input latch;

a serial access pipeline register having an output, said pipeline register coupled to said input latch;

an isolation device comprising a control input, a first terminal and a second terminal, the first terminal coupled to the output of said pipeline register;

a serial to parallel conversion register coupled to the second terminal;

an equilibration device coupled to the output of said pipeline register;

an access device having a control input, said access device coupled between said conversion register and said array of memory elements; and a timing control circuit coupled to said equilibration device, the control input of said access device and to the control input of said isolation device.

6. A memory device comprising:

a serial data bus;

an input latch coupled to said serial data bus;

a pipeline register coupled to said serial data bus;

a parallel data bus;

a serial to parallel conversion register coupled to said serial bus and to said parallel bus; and a memory array coupled to said parallel bus.

7. A data input path to a memory array, comprising:

an input register responsive to a clock signal;

a pipeline register coupled to said input register and responsive to the clock signal;

a serial access register coupled to said pipeline register and responsive to the clock signal; and a parallel data path coupled to said serial access register and to the memory array.

8. A memory device comprising:

a first I/O line;

a first register coupled to said first I/O line;

a second I/O line selectively coupled to said first register;

a second register coupled to said second I/O line;

a bus line selectively coupled to said second I/O line;

a memory cell selectively coupled to a digit line;

an equilibration device coupled to the digit line; and a third register selectively coupled to said bus line and selectively coupled to the digit line.

9. A memory device comprising:

a first I/O line;

a first register coupled to said first I/O line;

an input data line coupled to said first register;

a second register coupled to said input data line;

a bus line coupled to said second register;

a memory cell selectively coupled to a digit line;

an equilibration device coupled to the digit line; and a third register coupled to the digit line and selectively coupled to said bus line.

10. The memory device of claim 9 wherein said third register comprises a P-sense amplifier coupled to an N-sense amplifier.

11. A system comprising:

a microprocessor;

a serial data bus;

a parallel data bus coupled to said microprocessor; and a memory device coupled to said parallel data bus and said serial data bus, said memory device comprising:
a serial data port coupled to said serial data bus;
a serial data pipeline coupled to said serial data port;
a parallel data port coupled to said parallel data bus; and
a memory array coupled to said serial data pipeline and said parallel data port, said memory device adapted to receive serial data from said serial data bus through said serial access data port, through said serial data pipeline and into said memory array.

12. The system of claim 11 wherein said microprocessor is capable of receiving the serial data from said memory device via said parallel data bus.

13. A method of writing a data bit into a memory array, comprising steps of:

providing the data bit on a serial data bus;

latching the data bit in an input data latch in response to a first serial clock transition;

latching the data bit in a write register after said step of latching the data bit in the input data latch;

latching the data bit in a serial to parallel conversion register in response to a write transfer request; and storing the data bit in the memory array in response to the write transfer request after said step of latching the data bit in a serial to parallel conversion register.

14. A method of storing data in a memory device, comprising steps of:

providing a first data bit on a serial data bus;

latching the first data bit in an input data latch in response to a first serial clock transition;

latching the first data bit in a write register;

providing a second data bit on the serial data bus;

latching the second data bit in an input data latch in response to a second serial clock transition;

latching the second data bit in the write register;

latching the first data bit in a serial to parallel conversion register in response to the second serial clock transition;

latching the second data bit in the serial to parallel conversion register in response to a write transfer request; and transferring the first data bit and the second data bit from the serial to parallel conversion register to a memory array of the memory device in response to the write transfer request after said step of latching the second data bit in the serial to parallel conversion register.

15. A method of storing data in a row of a memory device, comprising steps of:

providing a data bit on a serial data bus;

latching the data bit in an input data latch in response to a serial clock transition;

latching the data bit in a pipeline register;

latching the data bit in a selected one of a plurality of flip flops of a serial access register in response to a write transfer request; and transferring contents of the plurality of flip flops to a row of the memory device in response to the write transfer request after said step of latching the data bit in the selected one of the plurality of flip flops.

* * * * *